(12) United States Patent   (10) Patent No.: US 8,878,606 B2
Khlat et al.   (45) Date of Patent: Nov. 4, 2014

(54) INDUCTANCE BASED PARALLEL AMPLIFIER PHASE COMPENSATION

(71) Applicant: RF Micro Devices, Inc., Greensboro, NC (US)

(72) Inventors: Nadim Khlat, Cugnaux (FR); Michael R. Kay, Summerfield, NC (US); Philippe Gorisse, Brax (FR)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/661,552

(22) Filed: Oct. 26, 2012

(65) Prior Publication Data

US 2013/0106508 A1    May 2, 2013

Related U.S. Application Data

(60) Provisional application No. 61/551,596, filed on Oct. 26, 2011, provisional application No. 61/562,493, filed on Nov. 22, 2011.

(51) Int. Cl.
*H03G 3/20* (2006.01)
*H02M 3/156* (2006.01)
*H02M 1/15* (2006.01)
*H02M 1/00* (2006.01)

(52) U.S. Cl.
CPC ...... *H02M 3/156* (2013.01); *H02M 2001/0045* (2013.01); *H02M 2001/0048* (2013.01); *H02M 1/15* (2013.01)
USPC .......................................................... 330/127

(58) Field of Classification Search
USPC ................... 330/127, 297; 323/282
See application file for complete search history.

(56) References Cited

U.S. PATENT DOCUMENTS

| | | |
|---|---|---|
| 3,969,682 A | 7/1976 | Rossum |
| 3,980,964 A | 9/1976 | Grodinsky |
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,311,309 A | 5/1994 | Ersoz et al. |

(Continued)

FOREIGN PATENT DOCUMENTS

| | | |
|---|---|---|
| EP | 0755121 A2 | 1/1997 |
| EP | 1492227 A1 | 12/2004 |

(Continued)

OTHER PUBLICATIONS

Non-Final Office Action for U.S. Appl. No. 13/188,024, mailed Feb. 5, 2013, 8 pages.

(Continued)

*Primary Examiner* — Steven J Mottola
(74) *Attorney, Agent, or Firm* — Withrow & Terranova, P.L.L.C.

(57) ABSTRACT

A direct current (DC)-DC converter, which includes a parallel amplifier and a switching supply, is disclosed. The switching supply includes switching circuitry, a first inductive element, and a second inductive element. The parallel amplifier has a feedback input and a parallel amplifier output. The switching circuitry has a switching circuitry output. The first inductive element is coupled between the switching circuitry output and the feedback input. The second inductive element is coupled between the feedback input and the parallel amplifier output.

27 Claims, 6 Drawing Sheets

(56) References Cited

U.S. PATENT DOCUMENTS

| | | |
|---|---|---|
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,483,281 B2 * | 11/2002 | Hwang ............ 323/299 |
| 6,559,689 B1 | 5/2003 | Clark |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,819,938 B2 | 11/2004 | Sahota |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,058,373 B2 | 6/2006 | Grigore |
| 7,099,635 B2 | 8/2006 | McCune |
| 7,164,893 B2 | 1/2007 | Leizerovich et al. |
| 7,200,365 B2 | 4/2007 | Watanabe et al. |
| 7,233,130 B1 | 6/2007 | Kay |
| 7,279,875 B2 | 10/2007 | Gan et al. |
| 7,394,233 B1 * | 7/2008 | Trayling et al. ............ 323/272 |
| 7,405,618 B2 | 7/2008 | Lee et al. |
| 7,411,316 B2 | 8/2008 | Pai |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,696,735 B2 | 4/2010 | Oraw et al. |
| 7,715,811 B2 | 5/2010 | Kenington |
| 7,724,837 B2 | 5/2010 | Filimonov et al. |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,289,084 B2 | 10/2012 | Morimoto et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,718,582 B2 | 5/2014 | See et al. |
| 2002/0071497 A1 | 6/2002 | Bengtsson et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0124913 A1 | 7/2004 | Midya et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2006/0006946 A1 | 1/2006 | Burns et al. |
| 2006/0097711 A1 | 5/2006 | Brandt |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0014382 A1 | 1/2007 | Shakeshaft et al. |
| 2007/0024360 A1 | 2/2007 | Markowski |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0259628 A1 | 11/2007 | Carmel et al. |

(56) References Cited

U.S. PATENT DOCUMENTS

| | | |
|---|---|---|
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0218995 A1 | 9/2009 | Ahn |
| 2009/0230934 A1 | 9/2009 | Hooijschuur et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0019840 A1 | 1/2010 | Takahashi |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2011/0018626 A1 | 1/2011 | Kojima |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049953 A1 | 3/2012 | Khlat |
| 2012/0068767 A1 | 3/2012 | Henshaw et al. |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0299647 A1 | 11/2012 | Honjo et al. |
| 2013/0034139 A1 | 2/2013 | Khlat et al. |
| 2013/0094553 A1 | 4/2013 | Paek et al. |
| 2013/0169245 A1 | 7/2013 | Kay et al. |
| 2013/0229235 A1 | 9/2013 | Ohnishi |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| EP | 2372904 A1 | 10/2011 |
| GB | 2462204 A | 2/2010 |
| GB | 2465552 A | 5/2010 |
| GB | 2484475 A | 4/2012 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006021774 A1 | 3/2006 |
| WO | 2006073208 A1 | 7/2006 |
| WO | 2007107919 A1 | 9/2007 |
| WO | 2007149346 A2 | 12/2007 |
| WO | 2012172544 A1 | 12/2012 |

OTHER PUBLICATIONS

Notice of Allowance for U.S. Appl. No. 13/188,024, mailed Jun. 18, 2013, 7 pages.
International Preliminary Report on Patentability for PCT/US2011/044857 mailed Mar. 7, 2013, 6 pages.
Notice of Allowance for U.S. Appl. No. 13/218,400 mailed Apr. 11, 2013, 7 pages.
International Search Report for PCT/US2011/054106 mailed Feb. 9, 2012, 11 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
Non-Final Office Action for U.S. Appl. No. 13/297,470 mailed May 8, 2013, 15 pages.
International Preliminary Report on Patentability for PCT/US2011/061009 mailed May 30, 2013, 10 pages.
Notice of Allowance for U.S. Appl. No. 13/222,453 mailed Feb. 21, 2013, 7 pages.
Non-Final Office Action for U.S. Appl. No. 13/423,649, mailed May 22, 2013, 7 pages.
International Search Report for PCT/US2012/40317 mailed Sep. 7, 2012, 7 pages.
International Search Report for PCT/US2012/046887 mailed Dec. 21, 2012, 12 pages.
Final Office Action for U.S. Appl. No. 13/222,484 mailed Apr. 10, 2013, 10 pages.
Advisory Action for U.S. Appl. No. 13/222,484, mailed Jun. 14, 2013, 3 pages.
International Search Report and Written Opinion for PCT/US2012/053654 mailed Feb. 15, 2013, 11 pages.
International Search Report and Written Opinion for PCT/US2012/062070, mailed Jan. 21, 2013, 12 pages.
International Search Report and Written Opinion for PCT/US2012/067230 mailed Feb. 21, 2013, 10 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.

(56) References Cited

OTHER PUBLICATIONS

Notice of Allowance for U.S. Appl. No. 14/022,858, mailed Oct. 25, 2013, 9 pages.
Non-Final Office Action for U.S. Appl. No. 13/550,049, mailed Nov. 25, 2013, 6 pages.
Non-Final Office Action for U.S. Appl. No. 12/836,307, mailed Nov. 5, 2013, 6 pages.
Examination Report for European Patent Application No. 11720630.0, mailed Aug. 16, 2013, 5 pages.
Final Office Action for U.S. Appl. No. 13/297,470, mailed Oct. 25, 2013, 17 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
International Preliminary Report on Patentability for PCT/US2012/040317, mailed Dec. 12, 2013, 5 pages.
Notice of Allowance for U.S. Appl. No. 13/531,719, mailed Dec. 30, 2013, 7 pages.
Non-Final Office Action for U.S. Appl. No. 14/022,940, mailed Dec. 20, 2013, 5 pages.
International Search Report and Written Opinion for PCT/US2013/052277, mailed Jan. 7, 2014, 14 pages.
Dixon, N., "Standardisation boosts momentum for Envelope tracking," Microwave Engineers, Europe, Apr. 20, 2011, 2 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Kim, N. et al, "Ripple feedback filter suitable for analog/digital mixed-mode audio amplifier for improved efficiency and stability," 33rd Annual Power Electronics Specialists Conference, vol. 1, Jun. 23, 2002, pp. 45-49.
Kim et al., "High Efficiency and Wideband Envelope Tracking Power Amplifier with Sweet Spot Tracking," 2010 IEEE Radio Frequency Integrated Circuits Symposium, May 23-25, 2010, pp. 255-258.
Knutson, P, et al., "An Optimal Approach to Digital Raster Mapper Design," 1991 IEEE Transactions on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira files 100th envelope tracking patent," CS: Compound Semiconductor, Apr. 11, 2011, 1 page.
Non-final Office Action for U.S. Appl. No. 12/112,006 mailed Apr. 5, 2010, now Patent No. 7,884,681, 6 pages.
Notice of Allowance for U.S. Appl. No. 12/112,006 now Patent No. 7,884,681, mailed Jul. 19, 2010, 6 pages.
International Search Report for PCT/US11/033037 mailed Aug. 9, 2011, 10 pages.
International Search Report for PCT/US2011/044857 mailed Oct. 24, 2011, 10 pages.
International Search Report for PCT/US11/49243 mailed Dec. 22, 2011, 9 pages.
International Search Report for PCT/US2011/064255 mailed Apr. 3, 2012, 12 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
International Search Report for PCT/US2011/061009 mailed Feb. 8, 2012, 14 pages.
International Search Report for PCT/US2012/023495 mailed May 7, 2012, 13 pages.
Invitation to Pay Additional Fees and Where Applicable Protest Fee for PCT/US2011/061007 mailed Feb. 13, 2012, 7 pages.
Hekkala, A. et al., "Adaptive time misalignment compensation in envelope tracking amplifiers," International Symposium on Spread Spectrum Techniques and Applications, Aug. 2008, pp. 761-765.
Invitation to Pay Additional Fees and Where Applicable Protest Fee for PCT/US2012/024124 mailed Jun. 1, 2012, 7 pages.
Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
International Search Report for PCT/US2011/061007 mailed Aug. 16, 2012, 16 pages.
International Search Report for PCT/US2012/024124 mailed Aug. 24, 2012, 14 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
International Preliminary Report on Patentability for PCT/US11/49243 mailed Nov. 13, 2012, 33 pages.
Non-final Office Action for U.S. Appl. No. 13/089,917 mailed Nov. 23, 2012, 6 pages.
International Preliminary Report on Patentability for PCT/US2011/033037 mailed Oct. 23, 2012, 7 pages.
Non final Office Action for U.S. Appl. No. 13/222,453 mailed Dec. 6, 2012, 13 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
International Search Report and Written Opinion for PCT/US2013/065403, mailed Feb. 5, 2014, 11 pages.
Notice of Allowance for U.S. Appl. No. 12/836,307 mailed May 5, 2014, 6 pages.
Notice of Allowance for U.S. Appl. No. 14/022,858 mailed May 27, 2014, 6 pages.
Non-Final Office Action for U.S. Appl. No. 13/367,973 mailed Apr. 25, 2014, 5 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.

(56) References Cited

OTHER PUBLICATIONS

Non-Final Office Action for U.S. Appl. No. 13/692,084 mailed Apr. 10, 2014, 6 pages.
Non-Final Office Action for U.S. Appl. No. 13/684,826 mailed Apr. 3, 2014, 5 pages.
Notice of Allowance for U.S. Appl. No. 141022,940, mailed Jun. 10, 2014, 7 pages.
Non-Final Office Action for U.S. Appl. No. 13/714,600 mailed May 9, 2014, 14 pages.
Non-Final Office Action for U.S. Appl. No. 13/951,976 mailed Apr. 4, 2014, 7 pages.
Examination Report for European Patent Application No. 11720630.0 issued Mar. 18, 2014, 4 pages.
International Preliminary Report on Patentability for PCT/US2012/062070 mailed May 8, 2014, 8 pages.
International Search Report and Written Opinion for PCT/US2012/062110 issued Apr. 8, 2014, 12 pages.
International Preliminary Report on Patentability for PCT/US2012/062110 mailed May 8, 2014, 9 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al, "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
European Search Report for Patent Application No. 14162682.0, issued Aug. 27, 2014, 7 pages.
International Preliminary Report on Patentability and Written Opinion for PCT/US2012/067230, mailed Jun. 12, 2014, 7 pages.
International Search Report and Written Opinion for PCT/US2014/028089, mailed Jul. 17, 2014, 10 pages.
Invitation to Pay Additional Fees and Partial International Search Report for PCT/US2014I028178, mailed Jul. 24, 2014, 7 pages.
Notice of Allowance for U.S. Appl. No. 14/072,140, mailed Aug. 27, 2014, 8 pages.
Non-Final Office Action for U.S. Appl. No. 14/072,225, mailed Aug. 15, 2014, 4 pages.
Non-Final Office Action for U.S. Appl. No. 13/486,012, mailed Jul. 28, 2014, 7 pages.
Notice of Allowance for U.S. Appl. No. 13/548,283, mailed Sep. 3, 2014, 7 pages.
Non-Final Office Action for U.S. Appl. No. 13/689,883, mailed Aug. 27, 2014, 12 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
Notice of Allowance for U.S. Appl. No. 13/684,826, mailed Jul. 18, 2014, 7 pages.
Non-Final Office Action for U.S. Appl. No. 13/782,142, mailed Sep. 4, 2014, 6 pages.

\* cited by examiner

INDUCTANCE BASED PARALLEL AMPLIFIER PHASE COMPENSATION

RELATED APPLICATIONS

This application claims the benefit of U.S. provisional patent application No. 61/551,596, filed Oct. 26, 2011, and U.S. provisional patent application No. 61/562,493, filed Nov. 22, 2011, the disclosures of which are incorporated herein by reference in their entireties.

FIELD OF THE DISCLOSURE

The present disclosure relates to direct current (DC)-DC converters and circuits that use DC-DC converters.

BACKGROUND

DC-DC converters often include switching power supplies, which may be based on switching at least one end of an energy storage element, such as an inductor, between a source of DC voltage and a ground. As a result, an output voltage from a DC-DC converter may have a ripple voltage resulting from the switching associated with the energy storage element. Typically, the ripple voltage is undesirable and is minimized as much as sizes and costs permit. Thus, there is a need to minimize ripple voltage using techniques that minimize sizes and costs.

SUMMARY

Embodiments of the present disclosure relate to a direct current (DC)-DC converter, which includes a parallel amplifier and a switching supply. The switching supply includes switching circuitry, a first inductive element, and a second inductive element. The parallel amplifier has a feedback input and a parallel amplifier output. The switching circuitry has a switching circuitry output. The first inductive element is coupled between the switching circuitry output and the feedback input. The second inductive element is coupled between the feedback input and the parallel amplifier output.

In one embodiment of the DC-DC converter, the parallel amplifier partially provides a first power supply output signal via the parallel amplifier output based on a voltage setpoint. The switching supply partially provides the first power supply output signal via the first inductive element and the second inductive element. The switching supply may provide power more efficiently than the parallel amplifier. However, the parallel amplifier may provide a voltage of the first power supply output signal more accurately than the switching supply. As such, in one embodiment of the DC-DC converter, the parallel amplifier regulates the voltage of the first power supply output signal based on the voltage setpoint of the first power supply output signal. Further, the switching supply regulates the first power supply output signal to minimize an output current from the parallel amplifier to maximize efficiency. In this regard, the parallel amplifier behaves like a voltage source and the switching supply behaves like a current source.

In one embodiment of the switching supply, a connection node is provided where the first inductive element and the second inductive element are connected to one another. The connection node provides a voltage to the feedback input. Further, in one embodiment of the parallel amplifier, the parallel amplifier has a limited open loop gain at high frequencies above a frequency threshold. At such frequencies, a group delay in the parallel amplifier may normally limit the ability of the parallel amplifier to accurately regulate the voltage of the first power supply output signal. However, by feeding back the voltage from the connection node to the feedback input instead of the voltage from the first power supply output signal, a phase-shift that is developed across the second inductive element at least partially compensates for the limited open loop gain of the parallel amplifier at frequencies above the frequency threshold, thereby improving the ability of the parallel amplifier to accurately regulate the voltage of the first power supply output signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
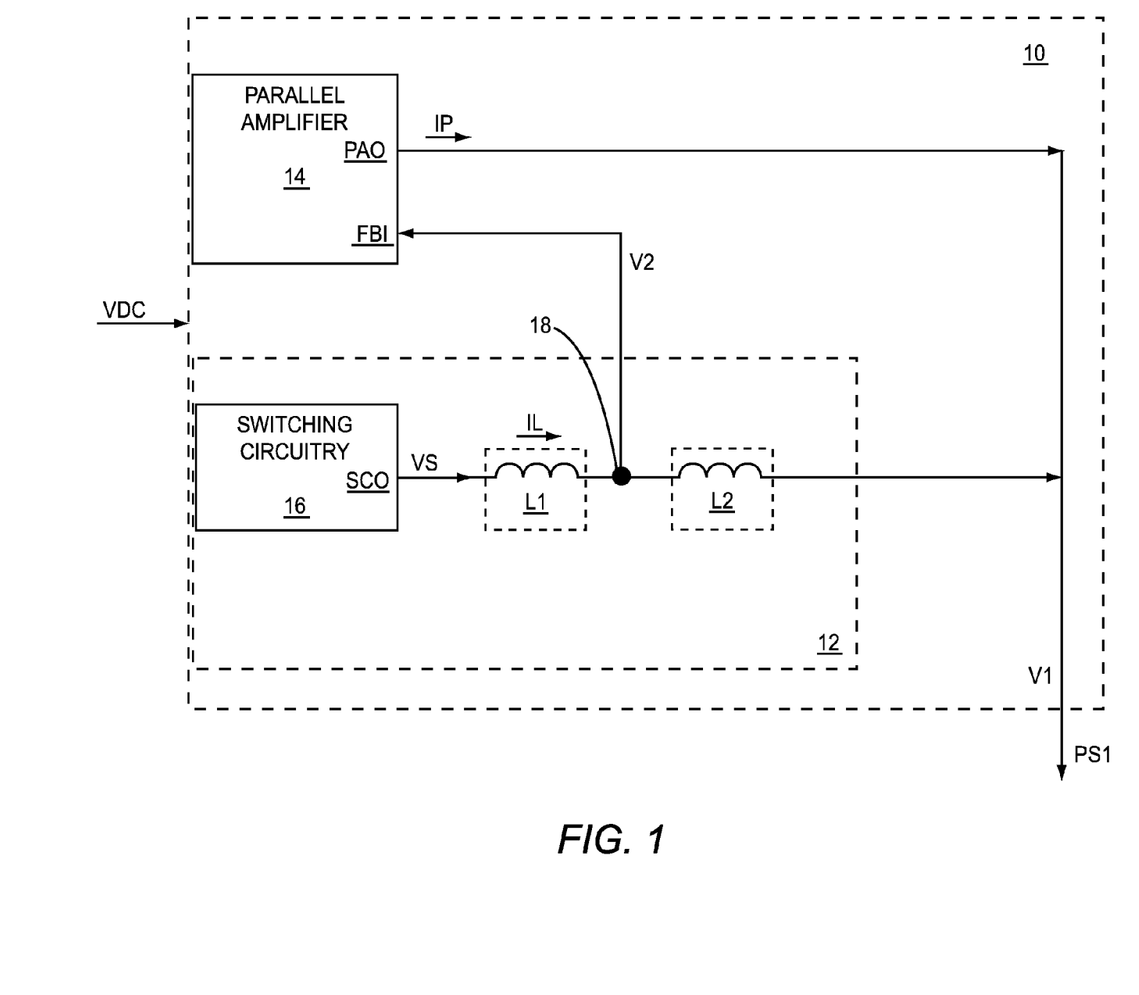
FIG. 1 shows a direct current (DC)-DC converter according to one embodiment of the present disclosure.

FIG. 1 shows a direct current (DC)-DC converter 10 according to one embodiment of the present disclosure. The DC-DC converter 10 includes a switching supply 12 and a parallel amplifier 14. The switching supply 12 includes switching circuitry 16, a first inductive element L1, and a second inductive element L2. The parallel amplifier 14 has a feedback input FBI and a parallel amplifier output PAO. The switching circuitry 16 has a switching circuitry output SCO. The first inductive element L1 is coupled between the switching circuitry output SCO and the feedback input FBI. The second inductive element L2 is coupled between the feedback input FBI and the parallel amplifier output PAO.

In one embodiment of the DC-DC converter 10, the parallel amplifier 14 partially provides a first power supply output signal PS1 via the parallel amplifier output PAO based on a voltage setpoint. The switching supply 12 partially provides the first power supply output signal PS1 via the first inductive element L1 and the second inductive element L2. Specifically, the switching supply 12 partially provides the first power supply output signal PS1 via a series combination of the first inductive element L1 and the second inductive element L2. The switching supply 12 may provide power more efficiently than the parallel amplifier 14. However, the parallel amplifier 14 may provide a voltage of the first power supply output signal PS1 more accurately than the switching supply 12. As such, in one embodiment of the DC-DC converter 10, the parallel amplifier 14 regulates the voltage, called a first voltage V1, of the first power supply output signal PS1 based on the voltage setpoint of the first power supply output signal PS1. Further, the switching supply 12 regulates the first power supply output signal PS1 to minimize an output current, called a parallel amplifier output current IP, from the parallel amplifier 14 to maximize efficiency. In this regard, the parallel amplifier 14 behaves like a voltage source and the switching supply 12 behaves like a current source. Additionally, the switching circuitry 16 provides a switching output voltage VS and an inductor current IL to the first inductive element L1 via the switching circuitry output SCO.

In one embodiment of the switching supply 12, a connection node 18 is provided where the first inductive element L1 and the second inductive element L2 are connected to one another. The connection node 18 provides a second voltage V2 to the parallel amplifier 14 via the feedback input FBI. Further, in one embodiment of the parallel amplifier 14, the parallel amplifier 14 has a limited open loop gain at high frequencies that are above a frequency threshold. At such frequencies, a group delay in the parallel amplifier 14 may normally limit the ability of the parallel amplifier 14 to accurately regulate the first voltage V1 of the first power supply output signal PS1. However, by feeding back the second voltage V2 to the feedback input FBI instead of the first voltage V1, a phase-shift that is developed across the second inductive element L2 at least partially compensates for the limited open loop gain of the parallel amplifier 14 at frequencies that are above the frequency threshold, thereby improving the ability of the parallel amplifier 14 to accurately regulate the first voltage V1. In this regard, in one embodiment of the DC-DC converter 10, the parallel amplifier 14 partially provides the first power supply output signal PS1 via the parallel amplifier output PAO based on the voltage setpoint and feeding back a voltage to the feedback input FBI from the connection node 18 between the first inductive element L1 and the second inductive element L2.

In one embodiment of the DC-DC converter 10, the DC-DC converter 10 receives a DC source signal VDC, such that the parallel amplifier 14 partially provides the first power supply output signal PS1 using the DC source signal VDC and the switching supply 12 partially provides the first power supply output signal PS1 using the DC source signal VDC.

Figure 2:
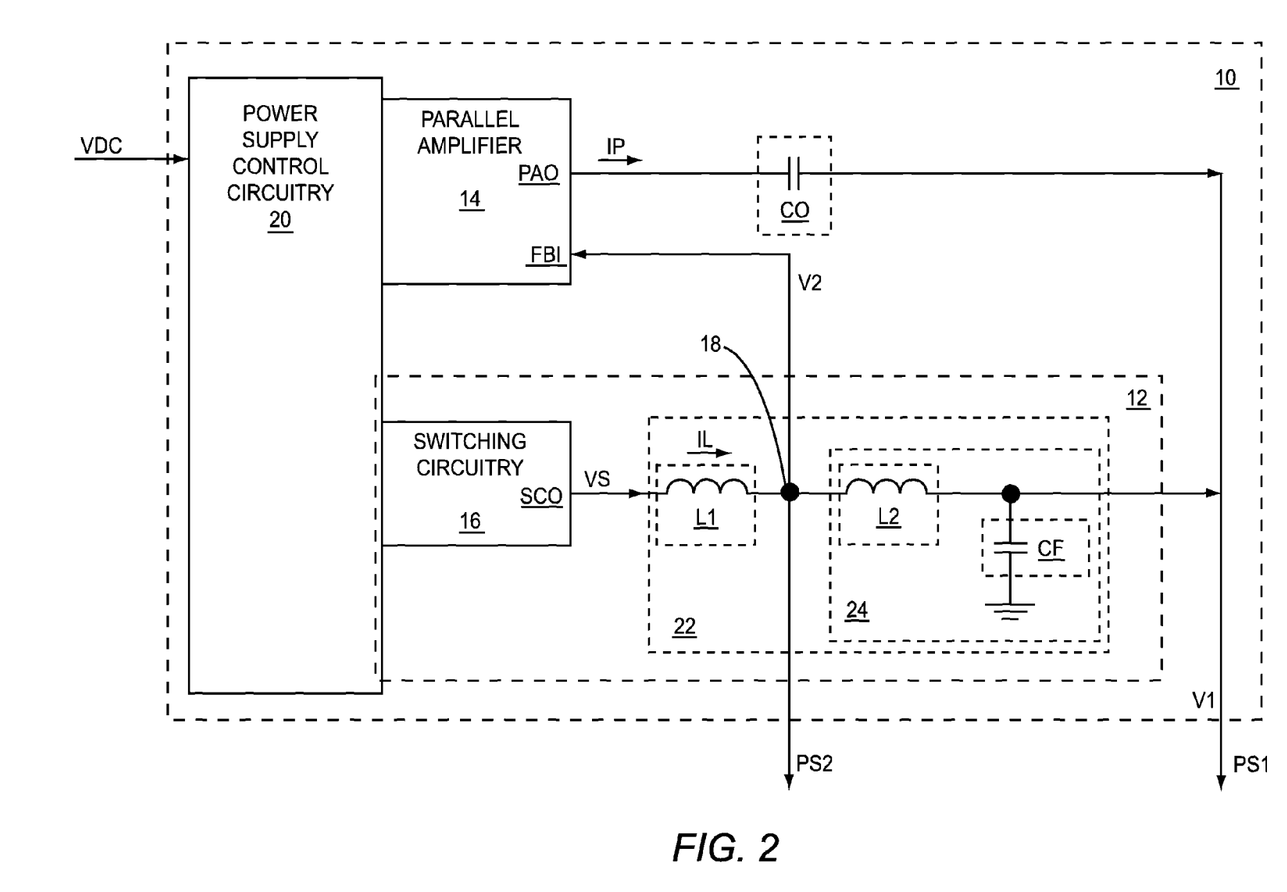
FIG. 2 shows the DC-DC converter according to an alternate embodiment of the DC-DC converter.

FIG. 2 shows the DC-DC converter 10 according to an alternate embodiment of the DC-DC converter 10. The DC-DC converter 10 illustrated in FIG. 2 is similar to the DC-DC converter 10 illustrated in FIG. 1, except the DC-DC converter 10 illustrated in FIG. 2 further includes power supply control circuitry 20 and an offset capacitive element CO. Additionally, the switching supply 12 further includes a filter capacitive element CF. The power supply control circuitry 20 receives the DC source signal VDC and is coupled to the parallel amplifier 14 and the switching circuitry 16. The first inductive element L1 and the second inductive element L2 provide a second power supply output signal PS2 via the connection node 18.

The offset capacitive element CO is coupled between the parallel amplifier output PAO and the second inductive element L2, such that the parallel amplifier 14 partially provides the first power supply output signal PS1 via the parallel amplifier output PAO and the offset capacitive element CO based on the voltage setpoint. The offset capacitive element CO allows the first voltage V1 to be higher than a voltage at the parallel amplifier output PAO. As a result, the parallel amplifier 14 may properly regulate the first voltage V1 even if the first voltage V1 is greater than a maximum output voltage from the parallel amplifier 14 at the parallel amplifier output PAO.

In general, the filter capacitive element CF is coupled between the parallel amplifier output PAO and a ground. In the embodiment of the DC-DC converter 10 illustrated in FIG. 2, the filter capacitive element CF is coupled between the parallel amplifier output PAO and the ground through the offset capacitive element CO. In an alternate embodiment of the DC-DC converter 10, the offset capacitive element CO is omitted, such that the filter capacitive element CF is directly coupled between the parallel amplifier output PAO and the ground. The first inductive element L1, the second inductive element L2, and the filter capacitive element CF form a first low-pass filter 22 having a first cutoff frequency. The second inductive element L2 and the filter capacitive element CF form a second low-pass filter 24 having a second cutoff frequency. The second cutoff frequency may be significantly higher than the first cutoff frequency. As such, the first low-pass filter 22 may be used primarily to filter the switching output voltage VS, which is typically a square wave. However, the second low-pass filter 24 may be used to target specific high frequencies, such as certain harmonics of the switching output voltage VS.

In a first embodiment of the first low-pass filter 22 and the second low-pass filter 24, the second cutoff frequency is at least 10 times greater than the first cutoff frequency. In a second embodiment of the first low-pass filter 22 and the second low-pass filter 24, the second cutoff frequency is at least 100 times greater than the first cutoff frequency. In a third embodiment of the first low-pass filter 22 and the second low-pass filter 24, the second cutoff frequency is at least 500 times greater than the first cutoff frequency. In a fourth embodiment of the first low-pass filter 22 and the second low-pass filter 24, the second cutoff frequency is at least 1000 times greater than the first cutoff frequency. In a fifth embodiment of the first low-pass filter 22 and the second low-pass filter 24, the second cutoff frequency is less than 1000 times greater than the first cutoff frequency. In a sixth embodiment of the first low-pass filter 22 and the second low-pass filter 24, the second cutoff frequency is less than 5000 times greater than the first cutoff frequency.

The first inductive element L1 has a first inductance and the second inductive element L2 has a second inductance. In a first embodiment of the first inductive element L1 and the second inductive element L2, a magnitude of the first inductance is at least 10 times greater than a magnitude of the second inductance. In a second embodiment of the first inductive element L1 and the second inductive element L2, a magnitude of the first inductance is at least 100 times greater than a magnitude of the second inductance. In a third embodiment of the first inductive element L1 and the second inductive element L2, a magnitude of the first inductance is at least 500 times greater than a magnitude of the second inductance. In a fourth embodiment of the first inductive element L1 and the second inductive element L2, a magnitude of the first inductance is at least 1000 times greater than a magnitude of the second inductance. In a fifth embodiment of the first inductive element L1 and the second inductive element L2, a magnitude of the first inductance is less than 1000 times greater than a magnitude of the second inductance. In a sixth embodiment of the first inductive element L1 and the second inductive element L2, a magnitude of the first inductance is less than 5000 times greater than a magnitude of the second inductance.

Figure 3:
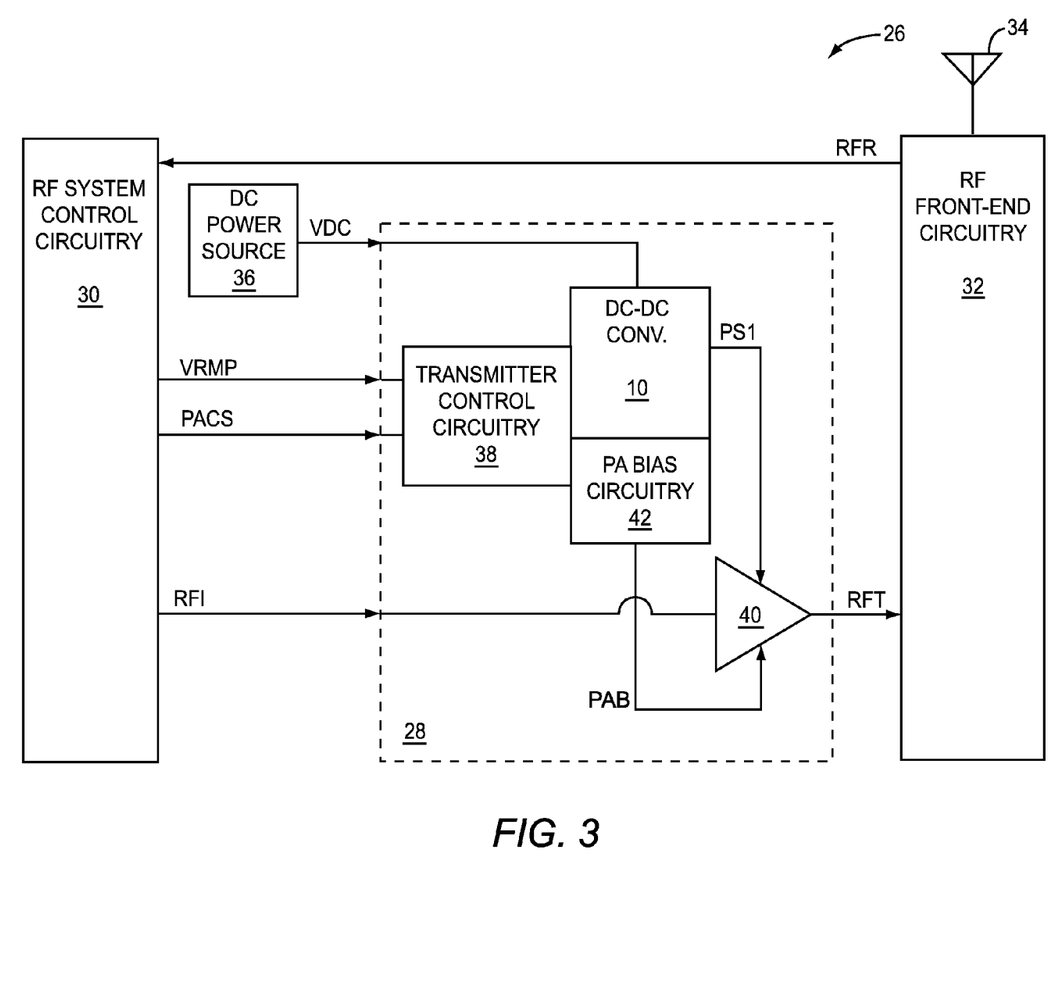
FIG. 3 shows a radio frequency (RF) communications system according to one embodiment of the present disclosure.

FIG. 3 shows a radio frequency (RF) communications system 26 according to one embodiment of the present disclosure. The RF communications system 26 includes RF transmitter circuitry 28, RF system control circuitry 30, RF front-end circuitry 32, an RF antenna 34, and a DC power source 36. The RF transmitter circuitry 28 includes transmitter control circuitry 38, an RF power amplifier (PA) 40, the DC-DC converter 10, and PA bias circuitry 42. The DC-DC converter 10 functions as an envelope tracking power supply. In an alternate embodiment of the RF communications system 26, the DC power source 36 is external to the RF communications system 26.

In one embodiment of the RF communications system 26, the RF front-end circuitry 32 receives via the RF antenna 34, processes, and forwards an RF receive signal RFR to the RF system control circuitry 30. The RF system control circuitry 30 provides a power supply control signal VRMP and a transmitter configuration signal PACS to the transmitter control circuitry 38. The RF system control circuitry 30 provides an RF input signal RFI to the RF PA 40. The DC power source 36 provides a DC source signal VDC to the DC-DC converter 10. In one embodiment of the DC power source 36, the DC power source 36 is a battery. In one embodiment of the power supply control signal VRMP, the power supply control signal VRMP is an envelope power supply control signal.

The transmitter control circuitry 38 is coupled to the DC-DC converter 10 and to the PA bias circuitry 42. The DC-DC converter 10 provides the first power supply output signal PS1 to the RF PA 40 based on the power supply control signal VRMP. As such, the first power supply output signal PS1 is a first envelope power supply signal. The DC source signal VDC provides power to the DC-DC converter 10. As such, the first power supply output signal PS1 is based on the DC source signal VDC. The power supply control signal VRMP is representative of the voltage setpoint of the first power supply output signal PS1. As such, the voltage setpoint is based on the power supply control signal VRMP. The RF PA 40 receives and amplifies the RF input signal RFI to provide an RF transmit signal RFT using the first envelope power supply signal, which is the first power supply output signal PS1. The first envelope power supply signal provides power for amplification to the RF PA 40. The RF front-end circuitry 32 receives, processes, and transmits the RF transmit signal RFT via the RF antenna 34. In one embodiment of the RF transmitter circuitry 28, the transmitter control circuitry 38 configures the RF transmitter circuitry 28 based on the transmitter configuration signal PACS.

The PA bias circuitry 42 provides a PA bias signal PAB to the RF PA 40. In this regard, the PA bias circuitry 42 biases the RF PA 40 via the PA bias signal PAB. In one embodiment of the PA bias circuitry 42, the PA bias circuitry 42 biases the RF PA 40 based on the transmitter configuration signal PACS. In one embodiment of the RF front-end circuitry 32, the RF front-end circuitry 32 includes at least one RF switch, at least one RF amplifier, at least one RF filter, at least one RF duplexer, at least one RF diplexer, at least one RF amplifier, the like, or any combination thereof. In one embodiment of the RF system control circuitry 30, the RF system control circuitry 30 is RF transceiver circuitry, which may include an RF transceiver IC, baseband controller circuitry, the like, or any combination thereof. In one embodiment of the RF transmitter circuitry 28, the first envelope power supply signal provides power for amplification and envelope tracks the RF transmit signal RFT.

Figure 4:
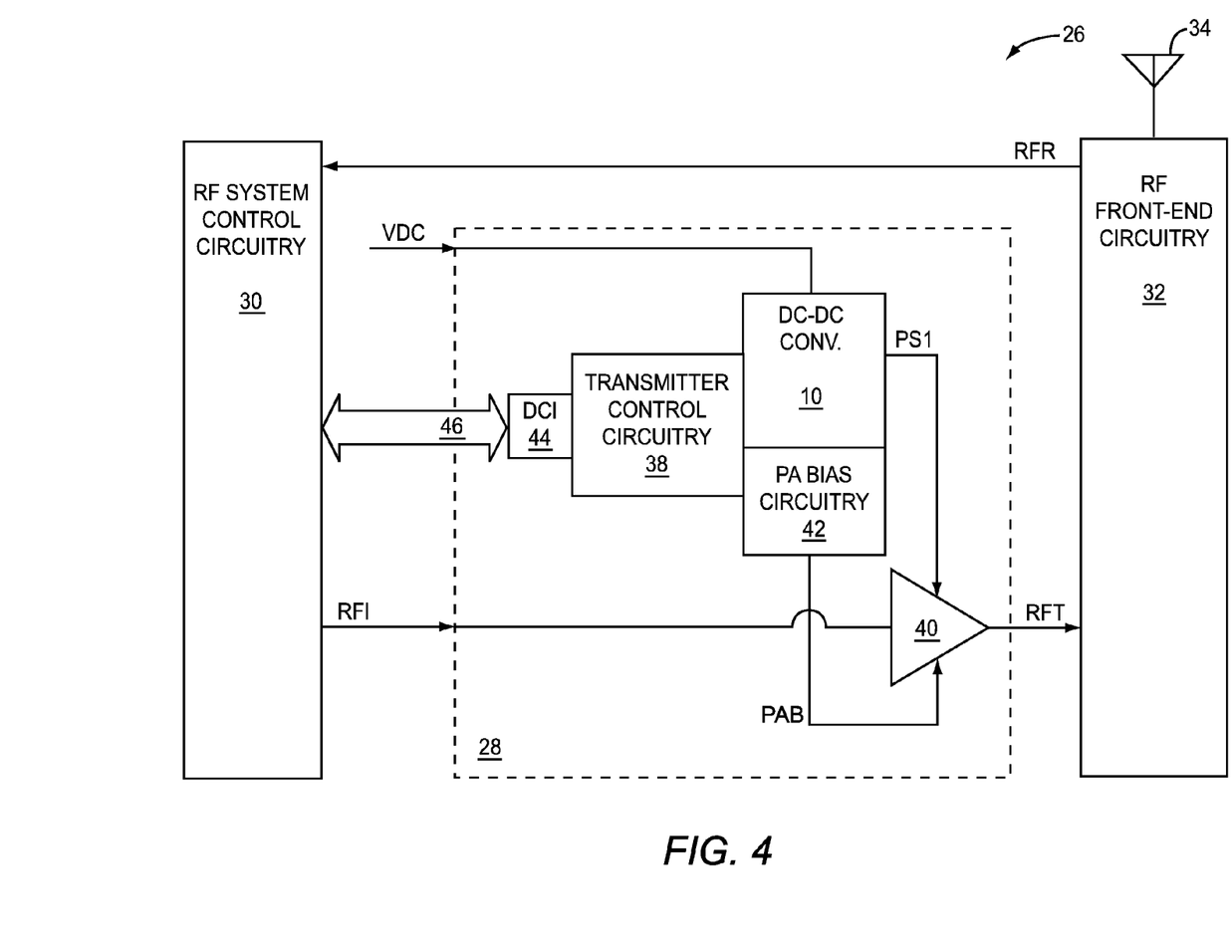
FIG. 4 shows the RF communications system according to an alternate embodiment of the RF communications system.

FIG. 4 shows the RF communications system 26 according to an alternate embodiment of the RF communications system 26. The RF communications system 26 illustrated in FIG. 4 is similar to the RF communications system 26 illustrated in FIG. 3, except in the RF communications system 26 illustrated in FIG. 4, the RF transmitter circuitry 28 further includes a digital communications interface 44, which is coupled between the transmitter control circuitry 38 and a digital communications bus 46. The digital communications bus 46 is also coupled to the RF system control circuitry 30. As such, the RF system control circuitry 30 provides the power supply control signal VRMP (FIG. 3) and the transmitter configuration signal PACS (FIG. 3) to the transmitter control circuitry 38 via the digital communications bus 46 and the digital communications interface 44.

Figure 5:
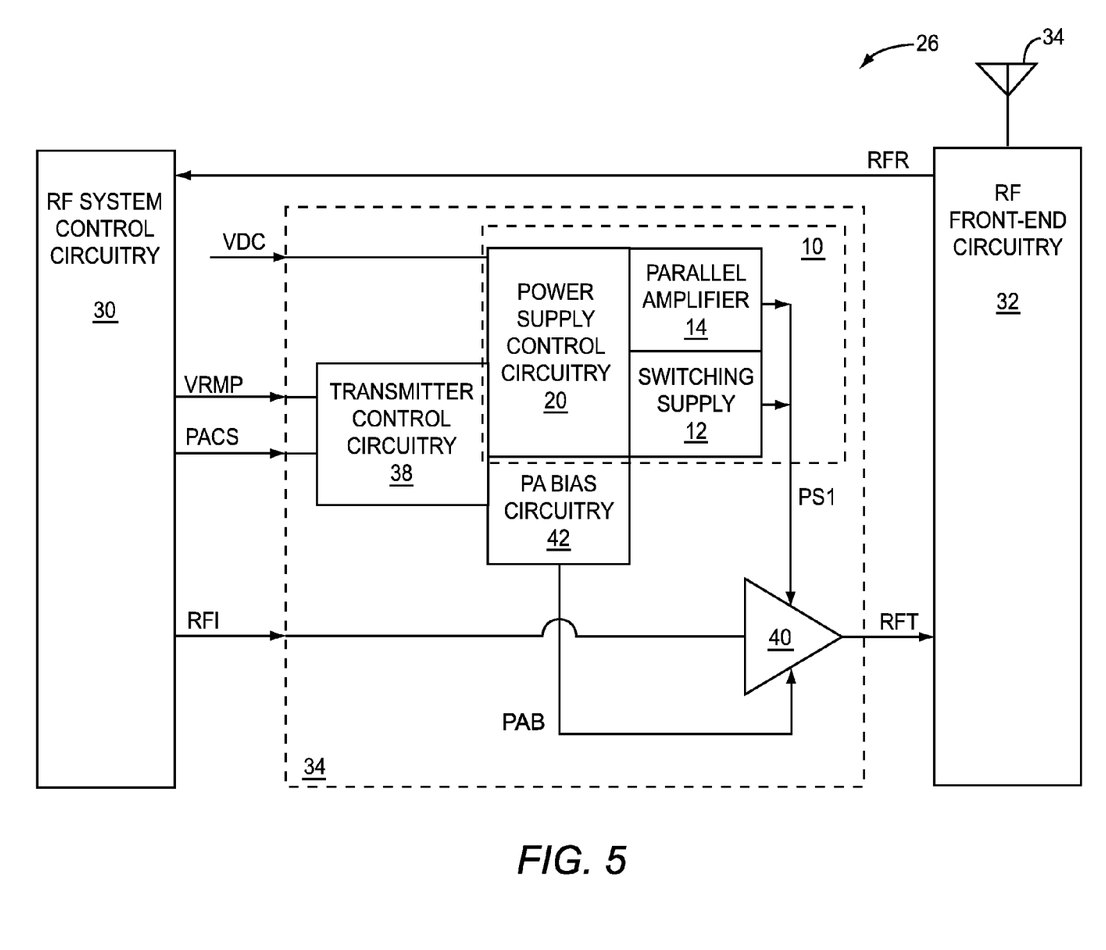
FIG. 5 shows the RF communications system according to an additional embodiment of the RF communications system.

FIG. 5 shows details of the DC-DC converter 10 illustrated in FIG. 3 according to one embodiment of the DC-DC converter 10. The DC-DC converter 10 includes the power supply control circuitry 20, the parallel amplifier 14, and the switching supply 12. The power supply control circuitry 20 controls the parallel amplifier 14 and the switching supply 12. The parallel amplifier 14 and the switching supply 12 provide the first power supply output signal PS1, such that the parallel amplifier 14 partially provides the first power supply output signal PS1 and the switching supply 12 partially provides the first power supply output signal PS1.

Figure 6:
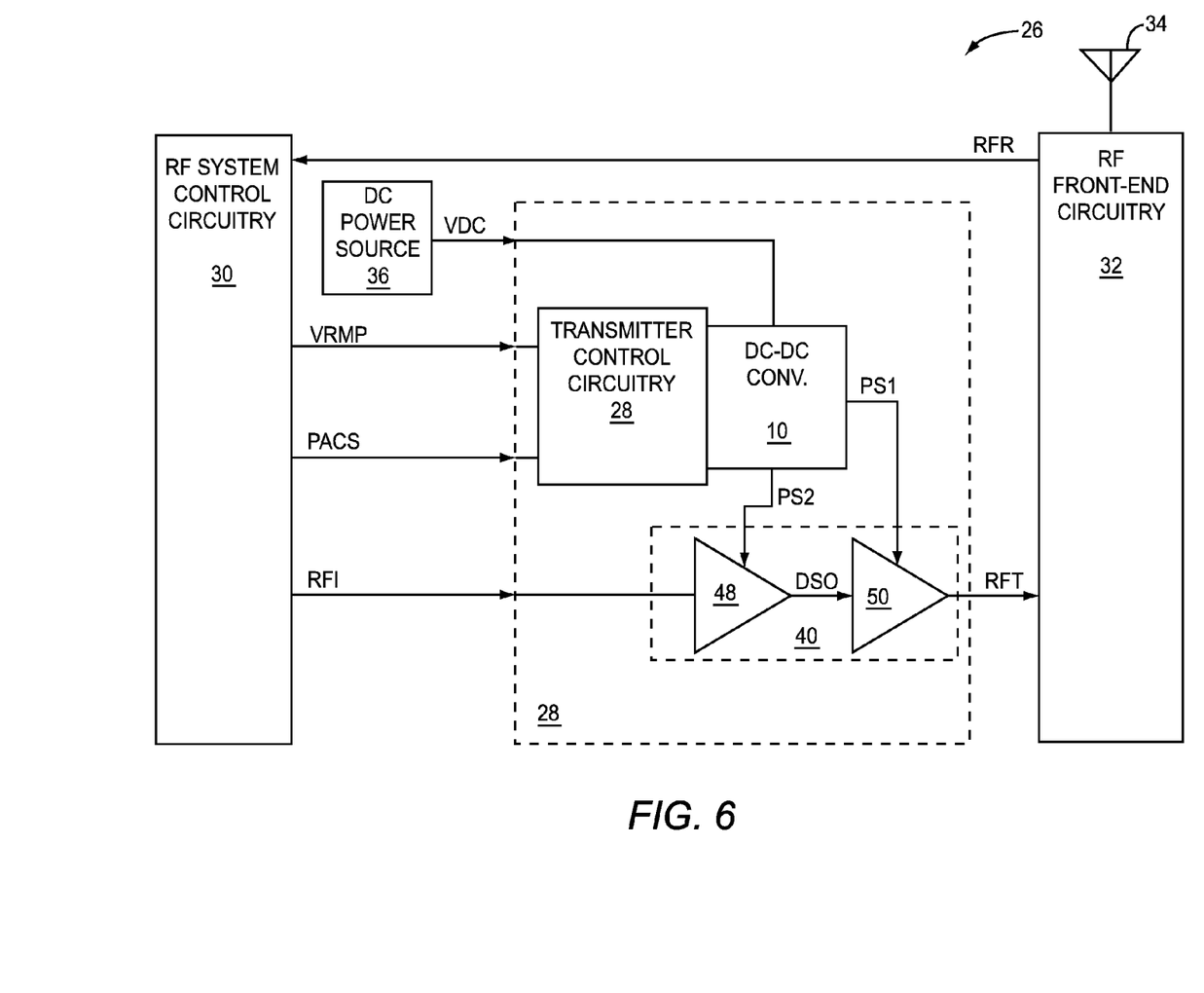
FIG. 6 shows the RF communications system according to another embodiment of the RF communications system.

FIG. 6 shows the RF communications system 26 according to another embodiment of the RF communications system 26. The RF communications system 26 illustrated in FIG. 6 is similar to the RF communications system 26 illustrated in FIG. 3, except in the RF communications system 26 illustrated in FIG. 6, the PA bias circuitry 42 (FIG. 3) is omitted and the RF PA 40 includes a driver stage 48 and a final stage 50, which is coupled to the driver stage 48. The DC-DC converter 10 provides the second power supply output signal PS2, which is a second envelope power supply signal, to the driver stage 48 based on the power supply control signal VRMP. Further, the DC-DC converter 10 provides the first power supply output signal PS1, which is the first envelope power supply signal, to the final stage 50 based on the power supply control signal VRMP. The driver stage 48 receives and amplifies the RF input signal RFI to provide a driver stage output signal DSO using the second envelope power supply signal, which provides power for amplification. Similarly, the final stage 50 receives and amplifies the driver stage output signal DSO to provide the RF transmit signal RFT using the first envelope power supply signal, which provides power for amplification.

An analysis of improved ripple cancellation performance of the DC-DC converter 10 illustrated in FIG. 2 is presented. In general, the first power supply output signal PS1 is fed to a load (not shown) having a load resistance RL, such as the RF PA 40 (FIG. 3). The switching output voltage VS has a DC component called a DC voltage VD and a ripple component called an AC voltage VA given by EQ. 1, as shown below.

$$VS = VD + VA. \qquad \text{EQ. 1:}$$

Further, the inductor current IL has a DC current ID and an AC current IA given by EQ. 2, as shown below.

$$IL = ID + IA. \qquad \text{EQ. 2:}$$

The DC-DC converter 10 regulates the DC voltage VD to be about equal to the voltage setpoint. The first inductive element L1 and the second inductive element L2 appear approximately as short circuits to the DC component. Further, the filter capacitive element CF appears approximately as an open circuit to the DC component. Therefore, the DC voltage VD is approximately applied to the load resistance RL, as intended. As a result, the DC current ID is based on the DC voltage VD and the load resistance RL, as shown in EQ. 3 below.

$$ID=VD/RL.\qquad\qquad\text{EQ. 3:}$$

Most of the ripple components of the switching output voltage VS is filtered out from the first voltage V1 by the first low-pass filter 22 and the second low-pass filter 24. As a result, most of the AC voltage VA is across the series combination of the first inductive element L1 and the second inductive element L2. The first inductive element L1 has a first inductance l1 and the second inductive element L2 has a second inductance l2. Therefore, the AC current IA is based on the AC voltage VA, the first inductance l1 and the second inductance l2, where s=j2πf, j=√−1, and f=frequency, as shown in EQ. 4 below.

$$IA=VA/[s(l1+l2)].\qquad\qquad\text{EQ. 4:}$$

Much of what remains of the ripple component is cancelled out from the first voltage V1 by the parallel amplifier 14. However, to the extent that the parallel amplifier 14 cannot completely cancel out the remains of the ripple component, the first voltage V1 has a first residual ripple voltage VR1 and the second voltage V2 has a second residual ripple voltage VR2. Two approaches to ripple cancellation will be compared against one another. In the first approach, the DC-DC converter 10 is the DC-DC converter 10 illustrated in FIG. 2, such that the second voltage V2 is fed to the feedback input FBI, as shown. In this regard, the second residual ripple voltage VR2 drives the parallel amplifier 14 to provide a ripple cancellation current, which is the parallel amplifier output current IP. In the second approach, the DC-DC converter 10 is similar to the DC-DC converter 10 illustrated in FIG. 2, except the first voltage V1 is fed to the feedback input FBI instead of the second voltage V2, such that the first residual ripple voltage VR1 drives the parallel amplifier 14 to provide the ripple cancellation current, which is the parallel amplifier output current IP.

In the following analysis, the parallel amplifier 14 has a DC open loop gain GO and an open loop bandwidth factor T. As a result, the parallel amplifier 14 has a gain G, as shown in EQ. 5 below.

$$G=GO/(1+sT).\qquad\qquad\text{EQ. 5:}$$

As a result, at frequencies significantly below an open loop bandwidth of the parallel amplifier 14, the open loop bandwidth factor T is small compared to one, such that the gain G approaches the DC open loop gain GO. Conversely, at frequencies significantly above the open loop bandwidth of the parallel amplifier 14, the open loop bandwidth factor T is large compared to one, such that the gain G approaches GO/sT.

In the first approach, described above wherein the second residual ripple voltage VR2 drives the parallel amplifier 14 and at frequencies significantly above the open loop bandwidth of the parallel amplifier 14, the parallel amplifier output current IP is based on the second residual ripple voltage VR2, as shown in EQ. 6 below.

$$IP=G*VR2\approx(GO*VR2)/sT.\qquad\qquad\text{EQ. 6:}$$

In the second approach described above, when the first residual ripple voltage VR1 drives the parallel amplifier 14 and at frequencies significantly above the open loop bandwidth of the parallel amplifier 14, the parallel amplifier output current IP is based on the first residual ripple voltage VR1, as shown in EQ. 7 below.

$$IP=G*VR1\approx(GO*VR1)/sT.\qquad\qquad\text{EQ. 7:}$$

However, a difference between the first residual ripple voltage VR1 and the second residual ripple voltage VR2 is based on the AC current IA and the second inductance l2, as shown in EQ. 8 and EQ. 9 below.

$$(VR2-VR1)=(s)(IA)(l2),\qquad\qquad\text{EQ. 8: or}$$

$$VR2=(s)(IA)(l2)+VR1.\qquad\qquad\text{EQ. 9:}$$

Substituting EQ. 9 into EQ. 6 provides EQ. 10 and EQ. 11, as shown below.

$$IP\approx(GO)(VR1)/sT+(GO)(s)(IA)(l2)/sT,\qquad\qquad\text{EQ. 10: or}$$

$$IP\approx(GO)(VR1)/sT+(GO)(IA)(l2)/T.\qquad\qquad\text{EQ. 11:}$$

EQ. 11 is representative of the first approach and EQ. 7 is representative of the second approach. As a reminder, in the first approach, the second residual ripple voltage VR2 drives the parallel amplifier 14 and in the second approach, the first residual ripple voltage VR1 drives the parallel amplifier 14. In both equations, a smaller first residual ripple voltage VR1 represents better ripple cancellation performance. For comparison purposes, both approaches are assumed to provide the same magnitude of parallel amplifier output current IP. However, in the second approach, the parallel amplifier output current IP is phase-shifted from the first residual ripple voltage VR1 by about 90 degrees. As such, the parallel amplifier output current IP is phase-shifted from the ripple current it is trying to cancel by about 90 degrees, thereby degrading ripple cancellation performance. However, in the first approach, according to EQ. 11, the parallel amplifier output current IP has two terms, namely the (GO)(VR1)/sT term and the (GO)(IA)(l2)/T term. The (GO)(VR1)/sT term has the same phase-alignment shortcoming as in the second approach. But the (GO)(IA)(l2)/T term phase-aligns the parallel amplifier output current IP with the ripple current it is trying to cancel. Overall, the phase-alignment in the first approach is improved over the second approach. Additionally, to the extent that the (GO)(VR1)/sT term is smaller than the (GO)(IA)(l2)/T term, the first residual ripple voltage VR1 is reduced, thereby improving ripple cancellation. In this regard, if the (GO)(IA)(l2)/T term is equal to the (GO)(VR1)/sT term in EQ. 7, then in the (GO)(VR1)/sT term in EQ. 11, the first residual ripple voltage VR1 is equal to about zero, such that the first approach is greatly improved over the second approach.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
a parallel amplifier having a feedback input and a parallel amplifier output; and
a switching supply comprising:
switching circuitry having a switching circuitry output;
a first inductive element coupled between the switching circuitry output and the feedback input; and
a second inductive element coupled between the feedback input and the parallel amplifier output, wherein the first inductive element has a first inductance and the second inductive element has a second inductance, such that a magnitude of the first inductance is at least 10 times greater than a magnitude of the second inductance.

2. Circuitry comprising:
a parallel amplifier having a feedback input and a parallel amplifier output, and adapted to partially provide a first power supply output signal via the parallel amplifier output based on a voltage setpoint; and
a switching supply comprising:
switching circuitry having a switching circuitry output;
a first inductive element coupled between the switching circuitry output and the feedback input; and
a second inductive element coupled between the feedback input and the parallel amplifier output, wherein the switching supply is adapted to partially provide the first power supply output signal via the first inductive element and the second inductive element.

3. The circuitry of claim 2 wherein the voltage setpoint is based on a power supply control signal.

4. The circuitry of claim 2 wherein:
the parallel amplifier is further adapted to regulate a voltage of the first power supply output signal based on the voltage setpoint; and
the switching supply is further adapted to regulate the first power supply output signal to minimize an output current from the parallel amplifier.

5. The circuitry of claim 2 wherein a phase-shift across the second inductive element at least partially compensates for limited open loop gain of the parallel amplifier at frequencies above a frequency threshold.

6. The circuitry of claim 2 further comprising a radio frequency (RF) power amplifier (PA), wherein:
the first power supply output signal is a first envelope power supply signal; and
the RF PA is adapted to receive and amplify an RF input signal to provide an RF transmit signal using the first envelope power supply signal.

7. The circuitry of claim 6 wherein the first envelope power supply signal provides power for amplification to the RF PA.

8. The circuitry of claim 6 wherein the RF PA comprises a final stage adapted to provide the RF transmit signal using the first envelope power supply signal.

9. The circuitry of claim 6 wherein:
the first inductive element and the second inductive element are connected to one another at a connection node;
the first inductive element and the second inductive element are adapted to provide a second power supply output signal via the connection node;
the second power supply output signal is a second envelope power supply signal;
the RF PA comprises a driver stage and a final stage, which is coupled to the driver stage;
the driver stage receives and amplifies the RF input signal to provide a driver stage output signal using the second envelope power supply signal; and
the final stage receives and amplifies the driver stage output signal to provide the RF transmit signal using the first envelope power supply signal.

10. The circuitry of claim 2 wherein:
a DC power source is adapted to provide a DC source signal to the parallel amplifier and to the switching supply;
the parallel amplifier is further adapted to partially provide the first power supply output signal using the DC source signal; and
the switching supply is further adapted to partially provide the first power supply output signal using the DC source signal.

11. The circuitry of claim 10 wherein the DC power source is a battery.

12. The circuitry of claim 10 further comprising the DC power source.

13. The circuitry of claim 2 wherein:
the first inductive element and the second inductive element are connected to one another at a connection node; and
the first inductive element and the second inductive element are adapted to provide a second power supply output signal via the connection node.

14. The circuitry of claim 1 wherein the switching supply further comprises an offset capacitive element coupled between the parallel amplifier output and the second inductive element, such that the parallel amplifier is further adapted to partially provide a first power supply output signal via the parallel amplifier output and the offset capacitive element based on a voltage setpoint.

15. The circuitry of claim 1 wherein the first inductive element has a first inductance and the second inductive element has a second inductance, such that a magnitude of the first inductance is at least 100 times greater than a magnitude of the second inductance.

16. The circuitry of claim 1 wherein the first inductive element has a first inductance and the second inductive element has a second inductance, such that a magnitude of the first inductance is at least 500 times greater than a magnitude of the second inductance.

17. The circuitry of claim 1 wherein the first inductive element has a first inductance and the second inductive element has a second inductance, such that a magnitude of the first inductance is at least 1000 times greater than a magnitude of the second inductance.

18. The circuitry of claim 1 wherein the first inductive element has a first inductance and the second inductive element has a second inductance, such that a magnitude of the first inductance is less than 1000 times greater than a magnitude of the second inductance.

19. The circuitry of claim 1 wherein the first inductive element has a first inductance and the second inductive element has a second inductance, such that a magnitude of the first inductance is less than 5000 times greater than a magnitude of the second inductance.

20. The circuitry of claim 1 wherein the switching supply further comprises a filter capacitive element coupled between the parallel amplifier output and a ground.

21. Circuitry comprising:
a parallel amplifier having a feedback input and a parallel amplifier output; and
a switching supply comprising:
switching circuitry having a switching circuitry output;
a first inductive element coupled between the switching circuitry output and the feedback input; and
a second inductive element coupled between the feedback input and the parallel amplifier output, wherein:

the switching supply further comprises a filter capacitive element coupled between the parallel amplifier output and a ground;

the first inductive element, the second inductive element, and the filter capacitive element form a first low-pass filter having a first cutoff frequency; and the second inductive element, and the filter capacitive element form a second low-pass filter having a second cutoff frequency.

22. The circuitry of claim 21 wherein the second cutoff frequency is at least 10 times greater than the first cutoff frequency.

23. The circuitry of claim 21 wherein the second cutoff frequency is at least 100 times greater than the first cutoff frequency.

24. The circuitry of claim 21 wherein the second cutoff frequency is at least 500 times greater than the first cutoff frequency.

25. The circuitry of claim 21 wherein the second cutoff frequency is at least 1000 times greater than the first cutoff frequency.

26. The circuitry of claim 21 wherein the second cutoff frequency is less than 1000 times greater than the first cutoff frequency.

27. The circuitry of claim 21 wherein the second cutoff frequency is less than 5000 times greater than the first cutoff frequency.

* * * * *

UNITED STATES PATENT AND TRADEMARK OFFICE
CERTIFICATE OF CORRECTION

| | | |
|---|---|---|
| PATENT NO. | : 8,878,606 B2 | Page 1 of 1 |
| APPLICATION NO. | : 13/661552 | |
| DATED | : November 4, 2014 | |
| INVENTOR(S) | : Nadim Khlat, Michael R. Kay and Philippe Gorisse | |

It is certified that error appears in the above-identified patent and that said Letters Patent is hereby corrected as shown below:

In the Specification:

In column 7, at line 14, replace "first inductance 11" with --first inductance l1--

In column 7, at line 15, replace "second inductance 12" with --second inductance l2--

In column 7, at line 16, replace "first inductance 11" with --first inductance l1--

In column 7, at line 17, replace "second inductance 12" with --second inductance l2--

In column 7, at line 20, replace "(I1+I2)" with --(l1+l2)--

In column 8, at line 7, replace "second inductance 12" with --second inductance l2--

In column 8, at lines 10, 12, replace "(I2)" with --(l2)--

In column 8, at lines 16, 18, replace "(I2)" with --(l2)--

In column 8, at lines 36, 38, 42, 45, replace "(I2)" with --(l2)--

Signed and Sealed this
Twenty-third Day of June, 2015

Michelle K. Lee
*Director of the United States Patent and Trademark Office*